United States Patent [19]

Jagannathan et al.

[11] Patent Number: 5,304,284

[45] Date of Patent: Apr. 19, 1994

[54] METHODS FOR ETCHING A LESS REACTIVE MATERIAL IN THE PRESENCE OF A MORE REACTIVE MATERIAL

[75] Inventors: Rangarajan Jagannathan, Hopewell Junction; Sampath Purushothaman, Yorktown Heights, both of N.Y.; Scott A. Sikorski, Cambridge, Mass.

[73] Assignee: International business Machines Corporation, Armonk, N.Y.

[21] Appl. No.: 785,445

[22] Filed: Oct. 18, 1991

[51] Int. Cl.$^5$ ............................................. H01L 21/00
[52] U.S. Cl. ................................... 156/666; 156/637; 156/664; 156/656; 423/27; 423/32
[58] Field of Search ............................ 423/27, 32, 33; 156/666, 637, 664, 656

[56] References Cited

U.S. PATENT DOCUMENTS

| | | |
|---|---|---|
| 3,677,950 | 7/1972 | Alderuccio . |
| 3,717,520 | 2/1973 | Brindial . |
| 4,543,153 | 9/1985 | Nelson . |
| 4,632,727 | 12/1986 | Nelson . |
| 4,767,661 | 8/1988 | Battey et al. . |
| 4,913,768 | 4/1990 | Wolf et al. . |
| 4,952,275 | 8/1990 | Lin et al. . |
| 4,985,310 | 1/1991 | Agarwala et al. . |

FOREIGN PATENT DOCUMENTS 973671 11/1982 U.S.S.R. .

OTHER PUBLICATIONS

J. Carr et al. "Technique to Fabricate Co-Planar Conductors in a Dielectric Layer" IBM Technical Disclosure Bulletin, vol. 33, No. 2, Jul. 1990 pp. 258–259.

"Cobalt Metallurgy for VLSI" IBM Technical disclosure Bulletin, vol. 29, No. 3, Oct., 1986, p. 2197.

Primary Examiner—Brian E. Hearn
Assistant Examiner—George Goudreau
Attorney, Agent, or Firm—Daniel P. Morris

[57] ABSTRACT

A method is described for providing a body of first material and a body of second material in a chemical environment wherein the first material contains first constituents having a lower and higher oxidation state and wherein the second material contains constituents having an oxidation state of energy greater than lower oxidation state of the first constituent. The environment is further provided with first cations energetically disposed for receiving electrons from the first constituents but not energetically disposed for receiving electrons from the second constituents. Electrons transfer from the first constituents to the first cations which are transformed thereby into second cations of lower oxidation state resulting in first body releasing into the environment third cations which are cations of the first (lower) oxidation state of the first constituent. The environment is further provided with an agent which consumes the second and third cations thereby permitting release into the environment additional ones of the third cations resulting in the first body being preferably etched with respect to the second body. The method is useful to etch copper in the presence of more highly reactive materials such as chrome, lead, tin, titanium, aluminum, iron, cobalt, and galvanically more active gold and nickel. The method is useful for forming structures containing copper having an overlying layer of the more highly reactive material without the requirement of the use of a resist material.

22 Claims, 2 Drawing Sheets

METHODS FOR ETCHING A LESS REACTIVE MATERIAL IN THE PRESENCE OF A MORE REACTIVE MATERIAL

FIELD OF THE INVENTION

This application is directed to methods for etching a less reactive material in the presence of a more reactive material. More particularly, the more reactive material is disposed against the less reactive material. More particularly, the materials are both metals. More particularly, material 1 to be etched has a lower and higher valence state and material 2 has only a higher valence state. More particularly, material 1 and material 2 are immersed in a non-aqueous solution containing an agent capable of complexing with the lower valence state of material 1. More particularly, when ions of the higher valence state of material 1 are introduced into the solution they react with material 1 which dissolves into the solution in the lower oxidation state where they complex with a complexing agent there by resulting in material 1 being etched even though material 2 is more chemically active. Most particularly, the solution is a non-aqueous solution.

BACKGROUND OF THE INVENTION

Interconnection circuitry and bonded terminal pad structures in microelectronic packages and devices are most commonly fabricated by additively pattern plating or vapor deposition. This is done through a mask with the required wiring and pad metallurgy disposed on top of a blanket base layer. Subsequently the exposed layer which is not below the pad metallurgy and the wiring metallurgy is subtractively etched. In this process, situations can occur wherein the top or second layer or stack of layers contain a metal that might be more vulnerable to attack by the etchants used to etch the base layer. An example of this is Cr/Cu/Co/Au bonding and terminal metallurgy which is described in U.S. Pat. No. 4,985,310 which is assigned to the assignee of the present invention, the teaching of which is incorporated herein by reference. The metallurgy described therein can be fabricated by starting with a Cr/Cu base blanket layer and pattern plating Co/Au thereover and then etching the Cr/Cu base layer.

In this metallization, the Co in the second stack will be attached by the etchant used to etch the Cu in the first stack. This is because Co is more reactive than Cu, in particular in aqueous red-ox reactions. This situation is not restricted to this particular application only. Other etching techniques in which there is a concern are the chemical-mechanical polishing of multi-layer metal stacks with incompatible combinations of metals to achieve planar metal-dielectric structures; and patterning of metal layers to form mask plates.

In the broadest sense the methods described herein are methods of etching a less reactive material in the presence of a more reactive material. The degree of reactiveness is defined on the basis of aqueous red-ox reactions.

Therefore, it is the object of the present invention to provide methods for etching a less reactive material in the presence of a more reactive material, using a non-aqueous etching medium.

The methods described herein are directed to an etching process which overcomes the disadvantages of etching in aqueous media described above. For example, FIGS. 1-4 show an example of a process generally described above wherein on a substrate 2 is disposed a layer 4 of a less reactive material on which is disposed a patterned lift off layer 6 having a pattern hole 8. Over the light off layer 6 is disposed a layer of the more reactive metal 10 of which 10' is disposed in pattern opening 8 of lift off layer 6. Layer 6 is removed as shown in FIG. 2 to leave the pattern 10' of the more reactive material. In order to remove that part of less reactive material beyond the periphery of the reactive material 10', 10' is coated with a resist material 12 as shown in FIG. 3. The structure of FIG. 3 is then exposed to an etchant which etches away that part of the less reactive material beyond the periphery of pattern 10' leaving the structure as shown in FIG. 4 with a patterned reactive material 4' below the pattern 10' of the more reactive material. The resist material 12 is removed leaving the structure shown in FIG. 5.

According to the present invention, the structure shown in FIG. 2 uses the pattern of more reactive material 10' as a mask for the etching of the layer 4 of the less reactive material to directly go from the structure of FIG. 2 to the structure of FIG. 5, thereby, avoiding the need to passivate the more reactive material layer 10' with a resist 12 as shown in FIG. 3. This is achieved by appropriately choosing the chemistry of the etchant system to selectively etch the less reactive material in the presence of the more reactive material 10.

In the chemistry of the method, the less reactive material has a lower and higher valence state and the more reactive material has an oxidation state of energy greater than the lower oxidation state of the less reactive material. Chemical environments are provided containing cations of the higher oxidation state of the less reactive material which react with the zero oxidation state of the less reactive material to produce cations of the lower oxidation state of the less reactive material. The chemical environment also contains an agent capable of complexing the lower oxidation state cations of the less reactive material, such that the concentration of the lower oxidation state does not reach an equilibrium condition, thereby permitting continued dissolution of the less reactive material.

U.S. Pat. No. 3,677,950 described a chemical etching solution particularly adapted to selectively dissolving copper from laminated printed wiring boards in the presence of metal selected from the group consisting of tin, lead, nickel, gold and alloys thereof. There is no mentioned of etching copper in the presence of a highly reactive metal such as cobalt. The method uses high concentration of ammonia which is difficult and hazardous to use in a manufacturing environment.

U.S. Pat. No. 3,717,520 describes an aqueous etchant for stripping Cu and Ni from ferrous metal and plastic substrates.

U.S. Pat. No. 4,543,153 describes a process for anisotropically etching Cu through a Ni-Au mask in an aqueous solution in a reactor by providing an electrical connection between the reactor wall and the Cu to maintain them at the same potential.

U.S. Pat. No. 4,632,727 describes an aqueous nitric acid based etchant for copper with a solder based etch resist.

U.S. Pat. No. 4,767,661 describes nitric acid based aqueous anisotropic etchants with selectivity to different copper crystal planes.

U.S. Pat. No. 4,913,768 describes substrates covered with a layer of Ni, Co, Mn and Ni/Fe or Ni/Co followed by electroless Cu and pattern plating. After plating both the electroless Cu and under layer Ni/Co are removed by etching with a single solution without any selectivity between materials.

U.S. Pat. No. 4,952,275 describes a non-aqueous solution to selectively etch Cu but not Ni, Ti, Cr which contains dimethyl sulfoxide and a halo carbon compound such as ethyl chloroacetate and carbon tetrachloride which are hazardous and difficult to use in a manufacturing environment. In contradistinction, the etch methods described herein are environmentally safe and compatible with manufacturing needs, and provide selectivity to etch the material that is normally less reactive in an aqueous medium.

IBM Technical Disclosure Bulletin, Vol. 33, No. 2, July 1990, p. 258-9 describes a subtractive etch technique for selectively removing Cu in a wet etch where certain regions are protected from the Cu wet etch by regions of Cr.

IBM Technical Disclosure Bulletin, Vol. 27, No. 5, October 1986 p. 2197 describes dry etching below an etch resistant mask of Co/Cu where the Co is between a W underlayer and Cu.

None of the above referenced claims teach a method wherein a less reactive metal is wet etched selectively in the presence of a more reactive material.

These and other objects, features and advantages will be apparent from the following description of the preferred embodiments, claims and the figures appended thereto.

SUMMARY OF THE INVENTION

In it's broadest aspect the present invention are methods of etching a less reactive material in the presence of a more reactive material.

More particularly, according to methods of the present invention, a body of a first material and a body of the second material is provided in the chemical environment. The first material contains first constituents having a lower and a higher oxidation state. The second material contains second constituents having an oxidation state of energy greater than the lower oxidation state of the first constituent of the first material. The chemical environment is provided with the first cations energetically disposed to receiving electrons from the first constituents of the first material but are not energetically disposed to receiving electrons from the second constituents of the second material. Electrons are transferred from the constituents of the first material to the first cations which are transformed thereby into second cations of lower oxidation state which results in the first body releasing into the chemical environment third cations which are cations of lower oxidation state of the first constituent. The chemical environment is also provided with an agent which consumes the second cation and the third cations thereby permitting a release into the chemical environment additional ones of the third cations resulting in the first body being preferably etched with respect to the second body.

In a more particular aspect of the present invention, the chemical environment is a solution.

In another more particular aspect of the present invention, the solution is a non-aqueous solution.

In another more particular aspect of the present invention, the first and second materials are metals.

In another ore particular aspect of the present invention the agent which consumes the second cations and the third cations is a complexing agent.

In another more particular aspect of the present invention, the complexing agent is organic.

In another more particular aspect of the present invention, the organic complexing agent is an alkene or alkylne.

DETAILED DESCRIPTION

Figure 1:
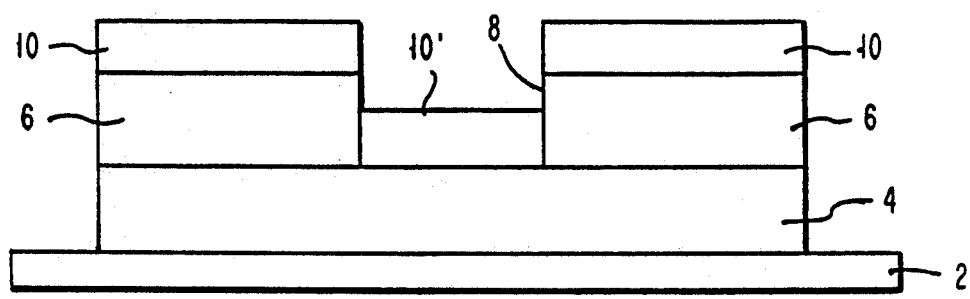
FIGS. 1-5 show prior art sequence and methods steps to etch less reactive material in the presence of a more reactive material.
Figure 2:
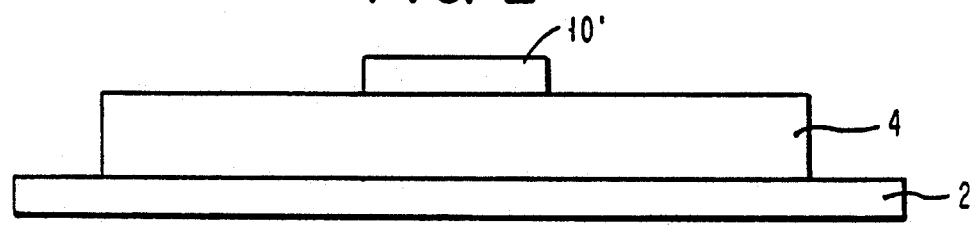
Figure 3:
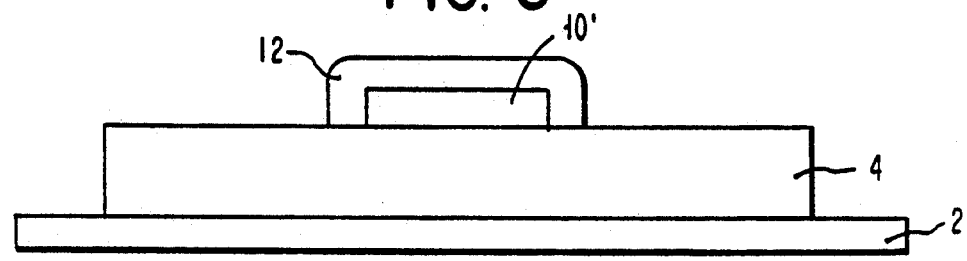
Figure 4:
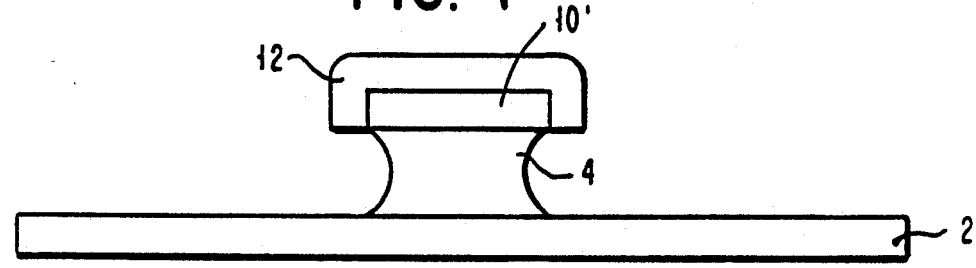
Figure 5:
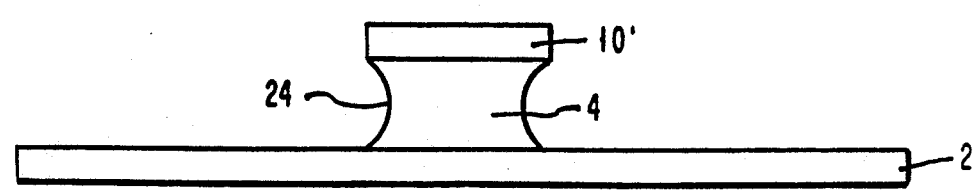
Figure 6:
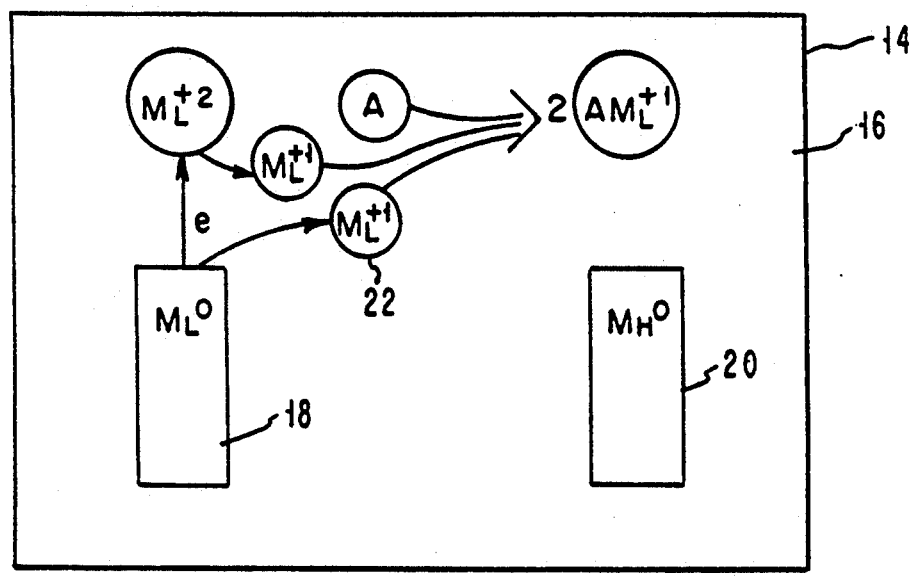
FIG. 6 diagrammatically shows a chemical environment containing a less reactive material and a more reactive material wherein the less reactive material is etched in the presence of the more reactive material according to the method of the present invention.

Referring to FIG. 5 outline 14 represents an enclosure within which there is a chemical environment 16. Within chemical environment 16, there is body 18 and body 20. Body 18 is of a lower reactive material than body 20 which is comprised of a higher reactive material. The lower reactive material is designated as $M_L$ and the higher reactive material is designated $M_H$. The lower reactive material, $M_L$, has at least two valence states of energy $E_L^1$ and $E_L^2$. In this illustration the energy should be taken as free energy of formation and the symbols do not follow standard conventions. The higher reactive material $M_H$ has at least one energy level having energy $E_H$. The material $M_L$ has a lower oxidation state with energy $E_L^1$ which is less than $E_H$. The materials in the neutral state are designated $M_L^0$ and $M_H^0$ having energy $E_L^0$ and $E_H^0$ respectively. The valence states correspond to the cationic form of the material for example, $M_L^1$ corresponds to the +1 form and $M_L^2$ corresponds to the +2 cationic form and $M_H^1$ corresponds to the +1 cationic form. In chemical environment 16 there is introduced cations of the higher valence state $M_L^2$, which will react with the material $M_L^0$ according to the following equation:

$$M_L^{+2} + M_L^0 \rightarrow 2M_L^{+1} \tag{1}$$

In this equation an electron is transferred from the material of object 18 to the dication $M_L^{+2}$ in solution as shown in FIG. 5. Into solution 16 there is introduced an agent, A, which consumes the monocations $M_L^{+1}$ shown in FIG. 5 as a complex $AM_L^{+1}$. Since $M_H^{+1}$ has a higher energy than $M_L^{+1}$, $M_H^0$ does not react with $M_L^{+2}$ to form monocations $M_H^{+1}$ One of the monocations $M_L^{+1}$ designated 22 in FIG. 5 results in a dissolution of body 18. Body 20 does not chemically react with $M_L^{+2}$ since the final energy of the products of the reaction

$$2M_L^{+2} + M_H^0 \rightarrow 2M_L^{+1} \tag{2}$$

has greater energy than the end products of the reaction between $M_L^0$ and $M_L^{+2}$.

In a preferred embodiment, chemical environment 16 is a solution. In the preferred embodiment the chemical environment 16 is not oxidizing. In an oxidizing environment, the end product of the reaction of equation 2 have lower energy than the end products of equation 1. Therefore, $M_H^0$ is more chemically reactive than $M_L M^0$.

The invention will be further described in terms of specific embodiment. This embodiment is exemplary only. The invention is not limited thereto. The specific embodiment deals with Cu and Co as an example of $M_L$ and $M_H$ combination. The method can be applied to other systems by appropriately selecting the red-ox reaction, non-aqueous solvent medium and a complexing agent. The process can be used in a wide variety of situations involving multiple metal structures by a judicious selection of the solution chemistry based on the principles outlined herein.

A layer of copper is disposed on the surface of a substrate. The substrate can be a semiconductor chip or a semiconductor chip packaging substrate. Preferably the copper layer will be disposed on a dielectric layer on a substrate. The layer of copper is disposed on the substrate by any means commonly known in the art, for example, sputter deposition, chemical vapor deposition, evaporation and the like. On the copper layer is disposed a layer of cobalt. The cobalt layer can be disposed by any means commonly known in the art such as sputter deposition, chemical vapor deposition, evaporation electroplating or electroless plating and the like. The cobalt can be disposed on the copper layer through a mask to form a cobalt pattern on the copper layer. Alternatively, as described hereinabove a lift off layer can be disposed on the copper layer, a pattern can be formed therein by commonly known photolithography techniques to expose through the liftoff layer the surface of the copper layer. The cobalt can be disposed over the liftoff layer and onto the surface of the copper in the pattern in the liftoff layer. The lift off layer can be dissolved by commonly known liftoff solvents to leave a pattern of cobalt regions on the surface of the copper layer.

In an aqueous medium cobalt is more reactive than the copper layer, therefore, the cobalt is expected to dissolve more readily and rapidly than copper. Therefore, the etching of copper in the Cu/Co structure in an oxidizing media, e.g. aqueous media, without attacking the Co is difficult, if not impossible to accomplish. the cupric ion, $Cu^{+2}$ in a non-aqueous solvent medium is a comparably powerful oxidizing agent. The situation is different in a non oxidizing environment, such as non-aqueous environments. The cupric ion corresponds to $M_L^{+2}$ of FIG. 5. The cupric ion reacts with copper metal which corresponds to $M_L^0$ of FIG. 5 to form cuprous ion. $Cu^{+1}$, which corresponds to $M_L^{+1}$.

Examples of non-aqueous solvents are: alcohols (e.g., methanol, ethanol, isopropanol), ethylene glycol, terpeneol, acetonitrile, propylene-carbonate. This list is exemplary only and not limiting.

The cuprous ion stability is readily enhanced in the non-aqueous environment, in contrast, cuprous ions undergo facile oxidation to the cupric ion in aqueous solutions. Alkenes and alkynes form stable complexes with cuprous ions in a non-aqueous solvent.

Examples of alkenes are: cychohexene, cyclooctene, n-hexene 2-Butene 1,4 diol. This list is exemplary only and not limiting.

Example of alkynes are 1-Hexyne, 3-Hexyne, 2-Butyn-1-ol, 3-Butyn-1-of. This list is exemplary only and not limiting.

The alkyne or alkene is used to provide coordination to copper in the +1 oxidation state and to stabilize cuprous ions in solution, that is, to make it energetically favorable for the cupric ion to react with the copper metal to form the cuprous ion. This essentially renders the cupric ion to act as a one electron oxidant. The cupric ion is therefore, rendered ineffective in etching or displacing cobalt which requires two electron process at a higher oxidation potential.

It is known that cobalt does not readily form the +1 oxidation state. The structure containing the copper layer with the pattern of cobalt thereon is immersed in a nonaqueous solution of a copper salt, a solvent and a complexing agent. The copper salt is the source of the cupric ion.

A non limiting exemplary list of copper salts useful in practice of the present invention is cupric fluoroborate, cupric trifluoromethane sulfonate, cupric methane sulfonate, cupric perchlorate, cupric hexafluoro phosphate.

Preferably a dehydrating agent is added to the solution to eliminate any traces of water which would otherwise act as an oxidizing medium. Examples of dehydrating agents are triethylorothoformate, dimethoxypropane, molecular seives, silica gel, calcium oxide. This list is exemplary only and not limiting.

The double and triple bond functionality of the alkenes and alkynes respectively provide the location to which the cuprous ion complexes.

The copper salt can be of any type but for achieving maximum selectivity in preferentially etching copper in the presence of cobalt a non-coordinating anion is preferred. Examples of non-coordinating anions are: tetrafluoro-borate, hexafluoro phosphate. For the situation in which copper is to be etched in the presence of cobalt, the anions trifluormethane sulfonate, tetrafluoroborate, perchlorate, hexfluorophosphate can be used. This list is exemplary only and not limiting.

In a typical experiment, a copper salt, cupric tetrafluoroborate, was dissolved at a concentration of from about 2 to about 10 grams per 80 mL in isopropanol. To this solution, preferably about 10 mL of triethyl orothoroformate and preferably about 10 mL of the alkene, 2-butene 1,4 diol, were added. The solution was stirred from about 30 minutes to about, preferably an hour. A substrate with 2 to 4 microns of copper and a substrate with 1-2 microns of cobalt was placed in the etching solution. The rates of etching of copper and cobalt were then determined from the weight loss measurements. The results of some of the findings are shown in the table. The etchant solution is capable of providing copper to cobalt selectivity ratios on the order of 200:1 by selecting appropriate etching bath composition.

| Cupric Tetrafluoroborate 80 ml Isopropyl Alcohol 10 ml Olefin 10 ml TEOF | | | |
|---|---|---|---|
| 4.0 | 5.0 | 6.0 g. | 8.0 g. |
| Cu 3.65 µm/hr | 6.00 µm/hr | 6.48 µm/hr | 6.51 µm/hr |
| Co 0.01 µm/hr | 0.09 µm/hr | neg.[1] | neg.[1] |

[1]Neg. means the etch rate is negligible (<.01 µm/hr).

In another typical experiment sample substrates having 0 to 1 micron thick cobalt pads over blanket 2 micron thick copper films were prepared. The substrates were subjected to a stringent test where they were placed in an etching solution without masking the cobalt structure. The solution contained Cupric tetrafluoroborate (4 grams), 2-Butene 1,4 diol (10 mL), Triethylthoformate (10 mL), Isopropylacohol (80 mL). Selective etching of the copper was achieved. In addition to showing the copper can be etched selectively, the etching is nonisotropic and there was no detectable undercut into the copper area below the cobalt pads. It is believed that the etching is nonisotropic since at surface 24 of FIG. 5 a dead layer exists wherein reaction of the cupric ion with the Cu metal is minimal. This aspect is a very desirable feature for etching fine patterns.

Copper can also be selectively etched with reduced undercut in the presence of other generally less readily reactive metals such as nickel, gold, copper, iron, titanium, tin, lead and chrome. This list is exemplary only and not limiting.

EXAMPLES

Although the structure of FIG. 5 shows only one layer 10' disposed in layer 4' both layer 10' and 4' can each be multilayer stacks as described in U.S. Pat. No. 4,985,310 incorporated herein by reference above.

In summary, a less reactive material is preferentially etched in the presence of a more reactive material by providing an environment wherein the dication of the more reactive material will react there with to produce the monocation which is stabilized by being consumed by a consuming agent, for example, a complexing agent, wherein the dication of the less reactive material is energetically not favorable to react with the more reactive material.

It is to be understood that the above described embodiments are simply illustrative of the principles of the invention. Various other modifications and changes may be devised by those of skill in the art which will embody the principles of the invention and fall within the spirit and scope thereof.

Having thus described the invention what is claimed as new and desired to be secured by Letters Patent is:

1. A method comprising:
   providing a body of a first material and a body of a second material in a substantially non-aqueous solution;
   said first material contains first constituents having a lower and a higher oxidation state;
   said second material contains second constituents having an oxidation state of energy greater than the lower oxidation state of said first constituents;
   providing in said solution first cations energetically disposed to receiving electrons from said first constituents but not energetically disposed to receiving electrons from said second constituents;
   electrons transfer from said first constituents to said first cations to form second cations of lower oxidation state, resulting in said first body releasing into said first lower oxidation state and resulting in etching of the first material; and
   providing in said solution an agent which consumes said second cations and said third cations thereby permitting release into said solution additional ones of said third cations resulting in said first body being preferably etched with respect to said second body.

2. A method comprising:
   providing a body of a first material and a body of a second material in a solution containing a dehydrating agent;
   said first material contains first constituents having a lower and a higher oxidation state;
   said second material contains second constituents having an oxidation state of energy greater than the lower oxidation state of said first constituents;
   providing in said solution first cations energetically disposed to receiving electrons from said first constituents but not energetically disposed to receiving electrons from said second constituents;
   electrons transfer from said first constituents to said first cations to form second cations of lower oxidation state, resulting in said first body releasing into said first lower oxidation state and resulting in etching of the first material; and
   providing in said solution an agent which consumes said second cations and said third cations thereby permitting release into said solution additional ones of said third cations resulting in said first body being preferably etched with respect to said second body.

3. The method of claim 1 or 2, wherein said first material is a metal.

4. The method of claim 1 or 2, wherein said agent is a complexing agent.

5. The method of claim 1 or 2, wherein said first material is Cu.

6. The method of claim 1 or 2, wherein said second material is selected from the group consisting of Pb, Sn, Al, Fe, Au and Co and alloys thereof.

7. The method of claim 1 or 2, wherein the consumption of said third cations results in the etching of said first body.

8. A method comprising:
   providing a substrate having a layer of Cu thereon;
   a patterned layer of material selected from the group consisting of Pd, Cr, Pb, Sn, Ni, Al, Fe, Au and Co and alloys thereof disposed over said Cu layer;
   contacting said Cu layer with said patterned layer thereon with a solution containing a complexing agent and a dehydrating agent;
   providing in said solution cupric ions which react with said Cu layer to form cuprous ions in solution which complex with said complexing agent; and
   said patterned layer being substantially nonreactive with said cupric ions, thereby resulting in the exposed areas of the said Cu layer dissolving into said solution to form a pattern Cu layer below said patterned layer.

9. The method of claim 1 or 2, wherein said first body is disposed in contact with said second body.

10. The method of claim 3, wherein said complexing agent is selected from the group consisting of 2-Butene 1,4 diol, cychohexane, 2-Butyn-1-ol, 1-hexyne.

11. The method of claim 1 or 2, wherein said solution contains a solvent selected from the group consisting of methanol, ethanol, isopropyl alcohol, ethylene glycol, terpeneol and mixtures thereof.

12. The method of claim 3, wherein said complexing agent is selected from the group consisting of alkenes and alkynes.

13. The method of claim 1 or 2, wherein said solution is non-oxidizing.

14. The method of claim 9, wherein said second body forms a pattern on said first body and wherein the consumption of said third cations results in the etching of said first body at regions thereof not covered by said pattern.

15. The method of claim 1 or 2, wherein said solution is a solution for a chemical mechanical polishing slurry.

16. The method of claim 14, wherein the thickness of said patterned layer is at least a mono layer.

17. The method of claim 14, wherein said etching is nonisotropic.

18. A method comprising:
   providing a substrate having a layer of Cu thereon;
   a patterned layer of Co disposed on said Cu layer;

contacting said Cu layer with said patterned layer thereon with a non-aqueous solution containing a complexing agent selected from the group consisting of alkenes and alkynes, providing in said solution cupric ions which react with said Cu layer to form cuprous ions in solution which complex with said complexing agent;

said patterned layer being substantially nonreactive with said cupric ions, thereby resulting in dissolving the exposing areas of the said Cu layer in the said solution to form a patterned Cu layer below said patterned layer.

19. A method comprising:

providing a substrate having a layer of Cu thereon;

a patterned layer of a material selected from the group consisting of Pd, Cr, Pb, Sn, Ni, Al, Fe, Au and Co and alloys thereof disposed over said Cu layer;

contacting said Cu layer with said patterned layer thereon with a non-aqueous solution containing a complexing agent;

providing in said solution cupric ions which react with said Cu layer to form cuprous ions in solution which complex with said complexing agent;

said patterned layer being substantially nonreactive with said cupric ions, thereby resulting in the exposed areas of the said Cu layer dissolving into said solution to form a patterned Cu layer below said patterned layer.

20. The method of claim 19, wherein said complexing agent is selected from the group consisting of alkenes and alkynes.

21. The method of claim 20, wherein said dissolving of said Cu layer is non isotropic.

22. The method of claim 19, wherein said cupric ion is provided by providing to the solution of cupric salt selected from the group consisting of: cupric tetrafluoroborate, cupric hexafluorophosphate, cupric methane sulfonate.

* * * * *